United States Patent
Stoecklein et al.

(10) Patent No.: US 6,784,599 B1
(45) Date of Patent: Aug. 31, 2004

(54) PIEZOELECTRIC ACTUATOR

(75) Inventors: Wolfgang Stoecklein, Stuttgart (DE); Friedrich Boecking, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/018,459

(22) PCT Filed: May 20, 2000

(86) PCT No.: PCT/DE00/01626
§ 371 (c)(1),
(2), (4) Date: Mar. 12, 2002

(87) PCT Pub. No.: WO00/79611
PCT Pub. Date: Dec. 28, 2000

(30) Foreign Application Priority Data

Jun. 19, 1999 (DE) .......................................... 199 28 179

(51) Int. Cl.⁷ ...................... H01L 41/08; H01L 41/083; H02N 2/04
(52) U.S. Cl. ...................... 310/364; 310/365; 310/328; 310/346; 310/349
(58) Field of Search ................................ 310/328, 346, 310/347, 355, 349, 364

(56) References Cited

U.S. PATENT DOCUMENTS

| | | | | |
|---|---|---|---|---|
| 4,550,744 A | * | 11/1985 | Igashira et al. | ................ 137/80 |
| 4,757,581 A | * | 7/1988 | Yamada et al. | ............ 29/25.35 |
| 5,548,178 A | * | 8/1996 | Eda et al. | .................... 310/349 |
| 6,617,766 B1 | * | 9/2003 | Stoecklein et al. | ......... 310/346 |

FOREIGN PATENT DOCUMENTS

| | | | | |
|---|---|---|---|---|
| DE | 30 37 078 A | 4/1982 | ........... H02N/11/00 |
| DE | 198 49 203 A | 4/2000 | .......... F02M/51/06 |

* cited by examiner

*Primary Examiner*—Thomas M. Dougherty
*Assistant Examiner*—J. Aguirrechea
(74) *Attorney, Agent, or Firm*—Ronald E. Greigg

(57) ABSTRACT

A piezoelectric actuator for actuating a mechanical component includes a piezoelectric element, for subjecting an actuating element to a tensile force or compressive force, and a compensating element, with the piezoelectric element and the compensating element having essentially the same coefficients of temperature expansion. The compensating element is mechanically coupled to the piezoelectric element in such a way that the temperature-caused expansions of the piezoelectric element and of the compensating element cancel one another out in the effective direction in such a way that the actuating element remains in its position.

16 Claims, 2 Drawing Sheets

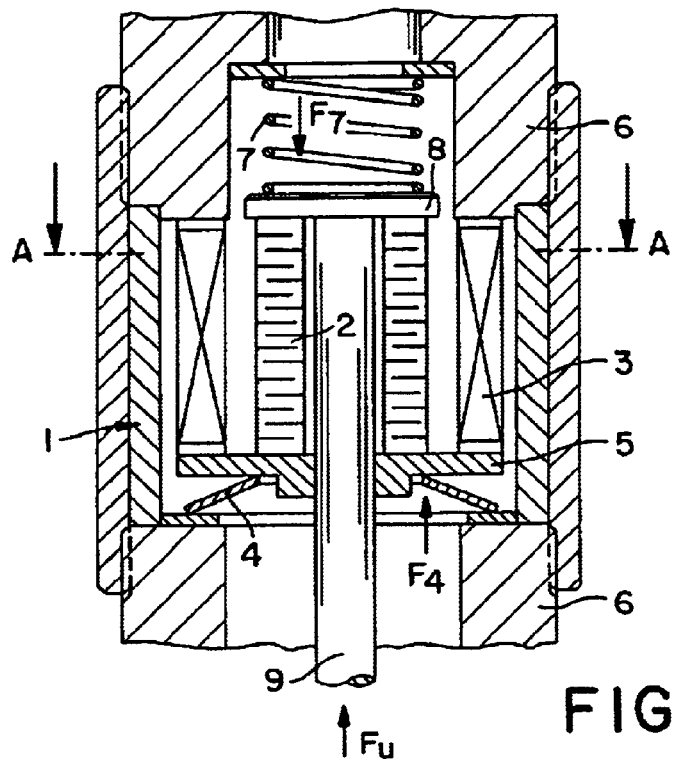
FIG. 1
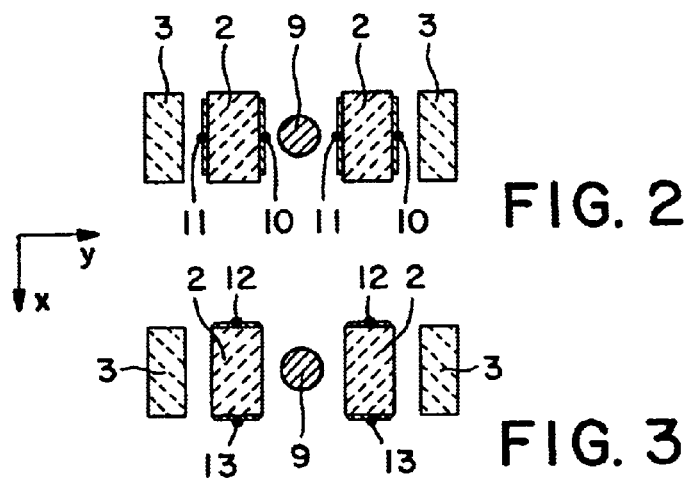
FIG. 2
FIG. 3
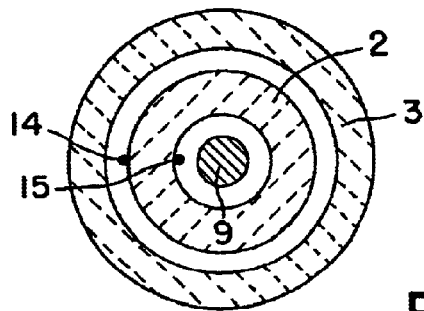
FIG. 4

PIEZOELECTRIC ACTUATOR

CROSS-REFERENCE TO RELATED APPLICATIONS

This application is a 35 USC 371 application of PCT/DE 00/01626 filed on May 20, 2000.

BACKGROUND OF THE INVENTION

1. Field of the Invention

The invention relates to a piezoelectric actuator, for instance for actuating a mechanical component such as a valve or the like.

2. Description of the Prior Art

It is widely known that by utilizing the so-called piezoelectric effect, a piezoelectric element can be constructed from a material with a suitable crystalline structure. When an external electrical voltage is applied, a mechanical reaction of the piezoelectric element takes place, which depending on the crystalline structure and the regions where the electrical voltage is applied causes a compression or tension in a predeterminable direction.

The aforementioned piezoelectric actuators are often used in the positioning of valves. Among other factors, it must be considered here that their stroke capacity for actuating a valve tappet, for instance, is relative slight. On the other hand, the different thermal expansion of the ceramic comprising the piezoelectric element as opposed to the housing causes problems; the piezoelectric element has only very slight temperature expansion, and the housing, which as a rule is of metal, has a positive temperature expansion, which can cause a drift in the position of the valve tappet without any triggering of the piezoelectric element.

In the conventional way, until now it was possible to reduce such problematic effects only by employing very expensive materials, such as invar, that have a negative temperature expansion. Another way was to connect a material of high temperature expansion in series with the piezoelectric element, but that reduces the rigidity of the system and hence the useful force.

SUMMARY OF THE INVENTION

The piezoelectric actuator described at the outset, which can be used for instance to actuate a mechanical component, advantageously has a piezoelectric element, parallel to which, according to the invention, a compensating element is disposed. It is especially advantageous that the piezoelectric element and the compensating element have essentially the same coefficients of temperature expansion, so that given a suitable mechanical mounting of the two elements, the temperature-caused expansions in the piezoelectric element and the compensating element cancel one another out in the effective direction in such a way that an actuating element solidly connected to a pressure plate of the piezoelectric element remains in its position. It is thus possible in a simple way to use a metal housing, for instance of steel, for the piezoelectric actuator as before and to brace the piezoelectric element in the housing in such a way that the compensating element is always solidly connected to the piezoelectric element for the sake of temperature compensation.

In an advantageous embodiment, the piezoelectric element in its effective direction rests with one end against a fixation edge of a housing via a spring and with its other end on another fixation edge of the housing via a pressure plate and a prestressing spring. A spring plate is also present, which is disposed between the piezoelectric element and the spring. According to the invention, the compensating element is additionally disposed on this spring plate and with its other end abuts the housing firmly and moreover is parallel to the piezoelectric element.

In a first refined embodiment, the piezoelectric element comprises a multilayered structure of transversely disposed ceramic piezoelectric layers, which lengthen in the effective direction when an external electrical voltage is suitably applied. The compensating element is likewise constructed of ceramic, with the same coefficients of temperature expansion as the layers of piezoceramic, but this ceramic has no piezoelectric effect. A possible differential expansion between the housing of the piezoelectric actuator and the piezoelectric element that would cause a deflection of the actuating element is thus compensated for via the spring that is located between the spring plate and the fixation edge of the housing.

In a second embodiment, the piezoelectric element likewise comprises a multilayered structure of transversely disposed ceramic piezoelectric layers, which lengthen in the effective direction when an external electrical voltage is applied. The compensating element here is constructed of longitudinally disposed piezoelectric layers, which shorten in the effective direction when an external electrical voltage is applied. Once again, as mentioned above, a possible differential expansion between the piezoelectric actuator housing and the piezoelectric element can be compensated for by means of the same temperature coefficient for the piezoelectric element and the compensating element and by means of the compensation via the aforementioned spring. However, in addition, this embodiment of the invention also makes it possible to lengthen the stroke of the piezoelectric actuator, so that other additional provisions such as a hydraulic coupling can be dispensed with. Because of the lengthened stroke, an otherwise possibly necessary stroke boost can also be dispensed with.

In advantageous refinements of the invention, the piezoelectric element and the compensating element can be constructed in bar form, with a round or rectangular cross section. It is also possible here for the piezoelectric element and the compensating element to comprise hollow cylinders, which are disposed about the axis of the actuating element, to make an overall cylindrical design of the piezoelectric actuator easier.

In a first application of the piezoelectric actuator of the invention, the end of the piezoelectric element by which it rests on the pressure plate, and thus exerts a force on the actuating element, can advantageously be disposed on the far side of the piezoelectric actuator in terms of the effective direction. In that case, the useful force of the piezoelectric actuator is a tensile force.

In a second advantageous application, the end of piezoelectric element by which it rests on the pressure plate, is disposed on the side of the piezoelectric actuator located in the effective direction. In this second case, the useful force of the piezoelectric actuator is a compressive force.

BRIEF DESCRIPTION OF THE DRAWINGS

Exemplary embodiments of the piezoelectric actuator of the invention with a narrow design, for instance for positioning a valve, will be explained herein below in conjunction with the drawings, in which:

FIG. 1, a section through a piezoelectric actuator, acting with a tensile force, with a compensating element of ceramic;

FIG. 2, a section taken along the line A—A of FIG. 1, with a barlike design of the piezoelectric element of FIG. 1 and showing a first possibility for lead bonding;

FIG. 3, a section corresponding FIG. 2, with a second possibility for lead bonding;

FIG. 4, a section taken along the line A—A of FIG. 1, with a hollow-cylindrical design of the piezoelectric element of FIG. 1;

DESCRIPTION OF THE PREFERRED EMBODIMENTS

Figure 5:
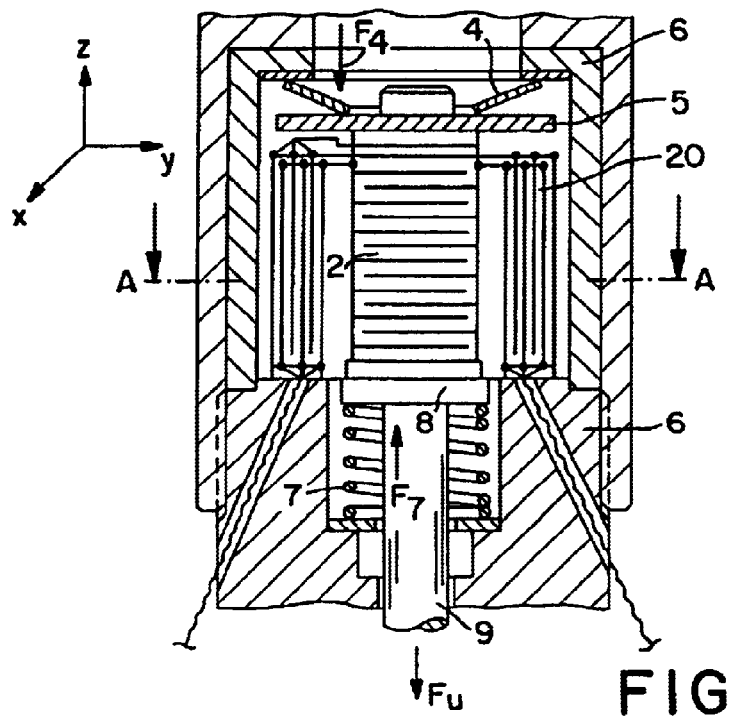
FIG. 5, a section through a piezoelectric actuator, acting with a compressive force, with a compensating element of piezoceramic layers.

In FIG. 1, a piezoelectric actuator 1 is shown, which has a piezoelectric element 2 that in a manner known per se is constructed of piezoelectric sheets of a quartz material of a suitable crystalline structure, so that by utilizing the so-called piezoelectric effect, when an external electrical voltage is applied to electrodes, not shown in this drawing, a mechanical reaction of the piezoelectric actuator 1 ensues.

In the piezoelectric actuator 1 of FIG. 1, the piezoelectric element 2 is of ceramic, and a compensating element 3, also of ceramic but without a piezoelectric effect, is pressed by a spring 4 via a spring plate 5 against a fixation edge of the housing 6. The elements 2 and 3 have the same coefficients of temperature expansion. The piezoelectric element 2 is prestressed from above by the prestressing spring 7 and a pressure plate 8, and the piezoelectric element 2 is constructed with transversely stacked layers in such a way that it lengthens when an electrical voltage is applied. The pressure plate 8 is solidly connected to a tie rod 9, which represents the actuating element, for instance for a valve tappet.

The prestressing force $F_7$ of the spring 7 must be substantially less than the prestressing force $F_4$ of the spring 4, so that for the maximum useful force $F_u$, in this case in the form a tensile force, of the piezoelectric actuator 1, the following equation applies:

$$F_u = F_4 - F_7$$

The stiffnesses of the springs 4 and 7 should be as slight as possible. Since the temperature expansion of the piezoelectric element 2 is the same as that of the compensating element 3, any possible differential expansion between the housing 6 and piezoelectric element 2 is compensated for via the spring 4.

FIGS. 2 and 3 each show an arrangement of barlike piezoelectric elements 2 and compensating elements 3 in a section along the line A—A in FIG. 1. The lead bondings 10, 11 of the piezoelectric elements 2 are done in the Y axis direction in the arrangement of FIG. 2, while lead bondings 12, 13 in FIG. 3 are done in the X direction.

In FIG. 4, an arrangement with hollow-cylindrical piezoelectric elements 2 and compensating elements 3 can be seen, again in a section along the line A—A of FIG. 1. In this arrangement, the lead bondings 14 and 15 of the piezoelectric element 2 are mounted on the radial side faces of the plezoelectric element 2.

A second exemplary embodiment of the piezoelectric actuator 1 is shown in FIG. 5, in which the components that function the same are provided with the same reference numerals as for FIG. 1. In the arrangement of FIG. 5 as well, the piezoelectric element 2 is of a suitable piezoceramic; a compensating element 20, however, is also constructed as a piezoelectric element, and in a modification of the example of FIG. 1, these elements 2 and 20 are pressed by the spring 4 via the spring plate 5 against a fixation edge located at the top of the housing 6.

The piezoelectric element 2 is layered transversely, so that when an electrical voltage is applied, it lengthens, as in the first exemplary embodiment. The piezoelectric layers of the compensating element 20 are conversely longitudinally layered or stacked, so that they shorten in the effective direction when an electrical voltage is applied to the piezoelectric actuator 1.

The prestressing force of the spring 7, by way of which the lower end of the piezoelectric element 2 rests on the housing, must be substantially less than the prestressing force of the spring 4, so that for the maximum useful force $F_u$, in this case in the form of a compressive force, of the piezoelectric actuator 1, the following equation applies:

$$F_u = F_7 - F_4$$

Once again, the stiffnesses of the springs 4 and 7 should be as slight as possible. When an electrical voltage is applied to the two elements 2 and 20, the sum of the two individual strokes of the two elements 2 and 20 is the resultant useful stroke. Since here again the temperature expansion of the two elements 2 and 20 is the same, any possible differential expansion between the housing 6 and the piezoelectric element 2 is once again compensated for via the spring 4.

Figure 6:
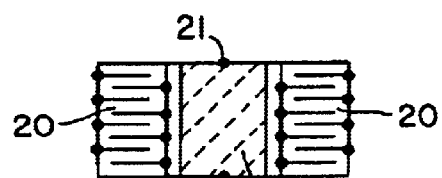
FIG. 6, a section taken along the line A—A of FIG. 5 with a barlike design of the piezoelectric elements of FIG. 5 and showing a first possibility for lead bonding.
Figure 7:
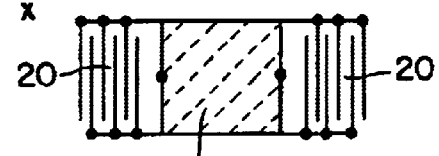
FIG. 7, a section corresponding to FIG. 6, showing a second possibility for lead bonding.

In FIG. 6 and FIG. 7, an arrangement with a barlike piezoelectric element 2 and likewise barlike compensating elements 20 can be seen in a section taken along the line A—A in FIG. 5. In FIG. 6, the lead bondings of the piezoelectric element 2 are made in the X direction and those of the compensating element 20 are made in the Y direction, while in the arrangement of FIG. 7, they are made in the Y direction for the piezoelectric element 2 and in the X direction for the compensating elements 20.

Figure 8:
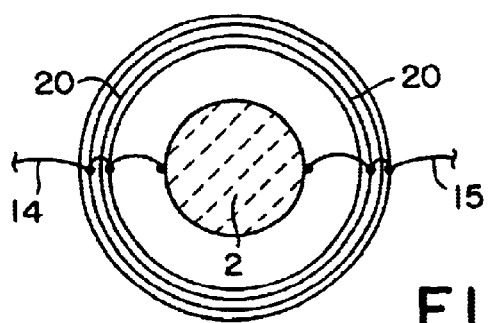
FIG. 8, a section taken along the line A—A of FIG. 5, with a hollow-cylindrical design of the piezoelectric elements of FIG. 5.

In FIG. 8, an arrangement with hollow-cylindrical piezoelectric elements 2 and compensating elements 20 can be seen, again in a section taken along the line A—A of FIG. 5. The lead bondings 14 and 15 of the piezoelectric element 2 and the compensating element 20 in this arrangement are mounted on the radial side faces.

The foregoing relates to preferred exemplary embodiment of the invention, it being understood that other variants and embodiments thereof are possible within the spirit and scope of the invention, the latter being defined by the appended claims.

We claim:

1. A piezoelectric actuator, comprising
   a piezoelectric element (2) for subjecting an actuating element (9) to a tensile force or compressive force, and a compensating element (3;20), the piezoelectric element (2) and the compensating element (3;20) having essentially the same coefficients of temperature expansion, wherein, the piezoelectric element (2) in its effective direction resting with one end against a fixation edge of a housing (6) via a spring (4) and with its other end on another fixation edge of the housing (6) via a pressure plate (8) and a prestressing spring (7), and
   a spring plate (5), which is disposed between the piezoelectric element (2) and the spring (4) and on which the compensating element (3;20) is additionally disposed, which with its other end abuts the housing (6) firmly and is located essentially parallel to the piezoelectric element (2), the piezoelectric element (2) and the compensating element (3;20) being hollow cylinders, which are disposed about the axis of the actuating element (9), and wherein the piezoelectric actuator further comprises a heat-conducting paste disposed between the piezoelectric element (2) and the compensating element (3;20).

2. The piezoelectric actuator of claim 1, wherein the piezoelectric element (2) comprises a multilayered structure of transversely disposed ceramic piezoelectric layers, which lengthen in the effective direction when an external electrical voltage is applied, and the compensating element (3) is constructed of ceramic.

3. The piezoelectric actuator of claims 2, wherein the piezoelectric element (2) and the compensating element (3;20) are constructed in bar form, with a substantially round or rectangular cross section.

4. The piezoelectric actuator of claim 3, wherein the end of piezoelectric element (2), by which it rests on the pressure plate (8), is disposed on the far side of the piezoelectric actuator (1) in terms of the effective direction, so that the useful force ($F_u$) of the piezoelectric actuator (1) is a tensile force.

5. The piezoelectric actuator of claim 2, wherein the end of piezoelectric element (2), by which it rests on the pressure plate (8), is disposed on the far side of the piezoelectric actuator (1) in terms of the effective direction, so that the useful force ($F_u$) of the piezoelectric actuator (1) is a tensile force.

6. The piezoelectric actuator of claim 2, wherein the end of piezoelectric element (2), by which it rests on the pressure plate (8), is disposed on the side of the piezoelectric actuator (1) located in the effective direction, so that the useful force ($F_u$) of the piezoelectric actuator (1) is a compressive force.

7. The piezoelectric actuator of claim 1, wherein the piezoelectric element (2) comprises a multilayered structure of transversely disposed ceramic piezoelectric layers, which lengthen in the effective direction when an external electrical voltage is applied; and that the compensating element (20) comprises longitudinally disposed piezoelectric layers, which shorten in the effective direction when an external electrical voltage is applied.

8. The piezoelectric actuator of claim 7, wherein the piezoelectric element (2) and the compensating element (3;20) are constructed in bar form, with a substantially round or rectangular cross section.

9. The piezoelectric actuator of claim 8, wherein the end of piezoelectric element (2), by which it rests on the pressure plate (8), is disposed on the far side of the piezoelectric actuator (1) in terms of the effective direction, so that the useful force ($F_u$) of the piezoelectric actuator (1) is a tensile force.

10. The piezoelectric actuator of claim 7, wherein the end of piezoelectric element (2), by which it rests on the pressure plate (8), is disposed on the far side of the piezoelectric actuator (1) in terms of the effective direction, so that the useful force ($F_u$) of the piezoelectric actuator (1) is a tensile force.

11. The piezoelectric actuator of claim 7, wherein the end of piezoelectric element (2), by which it rests on the pressure plate (8), is disposed on the side of the piezoelectric actuator (1) located in the effective direction, so that the useful force ($F_u$) of the piezoelectric actuator (1) is a compressive force.

12. The piezoelectric actuator of claim 1, wherein the piezoelectric element (2) and the compensating element (3;20) are constructed in bar form, with a substantially round or rectangular cross section.

13. The piezoelectric actuator of claim 12, wherein the end of piezoelectric element (2), by which it rests on the pressure plate (8), is disposed on the far side of the piezoelectric actuator (1) in terms of the effective direction, so that the useful force ($F_u$) of the piezoelectric actuator (1) is a tensile force.

14. The piezoelectric actuator of claim 1, wherein the end of piezoelectric element (2), by which it rests on the pressure plate (8), is disposed on the far side of the piezoelectric actuator (1) in terms of the effective direction, so that the useful force ($F_u$) of the piezoelectric actuator (1) is a tensile force.

15. The piezoelectric actuator of claim 1, wherein the end of piezoelectric element (2), by which it rests on the pressure plate (8), is disposed on the side of the piezoelectric actuator (1) located in the effective direction, so that the useful force ($F_u$) of the piezoelectric actuator (1) is a compressive force.

16. The piezoelectric actuator of claim 1, wherein the end of piezoelectric element (2), by which it rests on the pressure plate (8), is disposed on the side of the piezoelectric actuator (1) located in the effective direction, so that the useful force ($F_u$) of the piezoelectric actuator (1) is a compressive force.

* * * * *